United States Patent [19]

Nelson et al.

[11] Patent Number: 5,008,610
[45] Date of Patent: Apr. 16, 1991

[54] METHOD FOR HARMONIC NUMBER DETERMINATION IN A MICROWAVE FREQUENCY COUNTER

[75] Inventors: Nancy W. Nelson, San Jose; Lee D. Cosart, III, Palo Alto; Luiz Peregrino, Cupertino; Eric M. Ingman, Los Altos Hills, all of Calif.

[73] Assignee: Hewlett-Packard Company, Palo Alto, Calif.

[21] Appl. No.: 388,208

[22] Filed: Jul. 31, 1989

[51] Int. Cl.$^5$ .......................................... G01R 25/02
[52] U.S. Cl. ...................................................... 324/84
[58] Field of Search ............... 324/77 R, 78 R, 78 D, 324/79 R, 79 D, 84; 333/218; 375/1, 82, 99; 342/352, 386; 455/337, 619; 329/315; 364/443

[56] References Cited

U.S. PATENT DOCUMENTS

| | | | |
|---|---|---|---|
| 4,266,208 | 5/1981 | Cornish | 333/218 |
| 4,785,463 | 11/1988 | Janc et al. | 375/1 |
| 4,797,677 | 1/1989 | MacDoran | 342/352 |
| 4,816,769 | 3/1989 | Ma et al. | 455/337 |

Primary Examiner—Michael J. Tokar

[57] ABSTRACT

Method and apparatus for determining a generalized harmonic number in a harominic heterodyne converter wherein the frequency of an input signal is determined from a local oscillator frequency, an intermediate frequency obtained by mixing the local oscillator frequency with the input signal, and a harmonic number. The likelihood of error in determining harmonic number is reduced by providing a large separation between local oscillator frequencies that are used in determining harmonic number. The method involves the steps of determining an estimated harmonic number utilizing closely-spaced local oscillator frequencies and then utilizing the estimated harmonic number to compute widely-spaced local oscillator frequencies which are utilized for determining a corrected generalized harmonic number. One variation of the technique is utilized for high harmonic numbers, and another variation of the technique is utilized for low harmonic numbers.

15 Claims, 4 Drawing Sheets

METHOD FOR HARMONIC NUMBER DETERMINATION IN A MICROWAVE FREQUENCY COUNTER

FIELD OF THE INVENTION

This invention relates to instruments for measuring the frequency of a microwave signal and, more particularly, to methods and apparatus for accurately determining the harmonic number in a microwave frequency counter that utilizes harmonic heterodyne conversion.

BACKGROUND OF THE INVENTION

Frequency counters are digital instruments which measure the frequency of an input signal. Typically, the input signal operates a digital counter. In one counting technique, the count accumulated in the counter during a known time interval represents the frequency of the input signal. In an alternate counting technique, the time interval required to accumulate a predetermined count of input signal cycles is measured. The upper frequency limit for operation of digital circuitry is on the order of 500 MHz. In order to measure the frequencies of input signals above 500 MHz, it is necessary to down-convert the input signal to a lower frequency prior to frequency measurement. Down-conversion techniques include prescaling, heterodyne conversion, use of a transfer oscillator and harmonic heterodyne conversion. Of these techniques, harmonic heterodyne conversion is preferred because the number of microwave components is minimized, and measurements can be made up to 40 gigahertz.

The harmonic heterodyne converter utilizes a programmable local oscillator which provides a local oscillator frequency that is mixed with the input signal in a sampler. The output of the sampler is an intermediate frequency that is compatible with a digital frequency counter. The local oscillator frequency is varied until an output of the sampler falls within the intermediate frequency range. The frequency of the input signal is computed from the local oscillator frequency, the measured intermediate frequency and a harmonic number. The harmonic number identifies the harmonic of the local oscillator which is mixed with the input signal to produce the intermediate frequency. Since the intermediate frequency can be in either an upper sideband or a lower sideband, measurements are taken at two closely-spaced local oscillator frequencies in order to determine both the harmonic number and the sideband (upper or lower) in which the intermediate frequency is located.

The determination of harmonic number in the harmonic heterodyne technique is subject to various errors. Since the harmonic number can only be an integer, an error less than 0.5 is not significant, and rounding to the nearest integer produces a correct result. However, an error greater than 0.5 produces an erroneous harmonic number and causes a significant error in the measured microwave frequency.

A microwave frequency counter can be utilized to measure the frequency of both continuous wave and pulsed microwave signals. In the case of pulsed microwave signals having very short pulse durations, down conversion of the microwave signal results in an intermediate frequency pulse of only a few cycles. Such pulses are subject to measurement error due to the short observation time. Errors in harmonic number determination can also arise from frequency and amplitude variations of the input signal, and from other sources. It is desirable to provide a microwave frequency measurement technique wherein errors in harmonic number determination are minimized or eliminated.

It is a general object of the present invention to provide improved methods and apparatus for microwave frequency measurement.

It is another object of the present invention to provide methods and apparatus for accurate microwave frequency measurement.

It is a further object of the present invention to provide methods and apparatus for correcting errors in harmonic number determination in a harmonic heterodyne converter.

SUMMARY OF THE INVENTION

According to the present invention, these and other objects and advantages are achieved in a method and apparatus for determining a generalized harmonic number in a harmonic heterodyne converter wherein the frequency of an input signal is determined from a local oscillator frequency, an intermediate frequency obtained by mixing the local oscillator frequency with the input signal, and a harmonic number. The method provides a reduced likelihood of error in determining harmonic number in comparison with prior art techniques. The error is minimized by providing a large separation between local oscillator frequencies that are used in determining harmonic number. In a broad sense, the invention involves the steps of determining an estimated harmonic number utilizing closely-spaced local oscillator frequencies and then utilizing the estimated harmonic number to compute widely-spaced local oscillator frequencies which are utilized for determining a corrected generalized harmonic number. One variation of the basic technique is utilized for high harmonic numbers, and another variation of the basic technique is utilized for low harmonic numbers.

Initially, an estimated harmonic number is computed from closely-spaced first and second local oscillator frequencies and first and second intermediate frequencies obtained by successively mixing the first and second local oscillator frequencies with the input signal. The first and second local oscillator frequencies are known, and the first and second intermediate frequencies are measured.

When the estimated harmonic number is greater than a predetermined value, a third local oscillator frequency is selected such that a harmonic number corresponding to the third local oscillator frequency differs from the estimated harmonic number by a predetermined integer. In general, a different harmonic number and a different sideband can be selected. Typically, the adjacent harmonic number and the same sideband are selected. A third intermediate frequency obtained by mixing the third local oscillator frequency with the input signal is measured. Finally, a corrected generalized harmonic number is computed from the first and third local oscillator frequencies and the first and third intermediate frequencies.

When the estimated harmonic number is less than or equal to the predetermined value, an alternate of the above-described technique is used. The estimated harmonic number is determined in the manner described above. Then, widely-spaced third and fourth local oscillator frequencies are selected that produce intermediate frequencies within the allowable range at the same harmonic number as the estimated harmonic number. Preferably, the step of selecting the third and fourth oscillator frequencies includes the steps of computing a local oscillator center frequency consistent with the estimated harmonic number and the intermediate frequency range, and establishing the third and fourth local oscillator frequencies above and below the local oscillator center frequency by a predetermined frequency difference. Third and fourth intermediate frequencies obtained by successively mixing the third and fourth local oscillator frequencies with the input signal are measured. A corrected generalized harmonic number is computed from the third and fourth local oscillator frequencies and the third and fourth intermediate frequencies.

BRIEF DESCRIPTION OF THE DRAWINGS

For a better understanding of the present invention together with other and further objects, advantages and capabilities thereof, reference is made to the accompanying drawings which are incorporated herein by reference and in which.

DETAILED DESCRIPTION OF THE INVENTION

Figure 1:
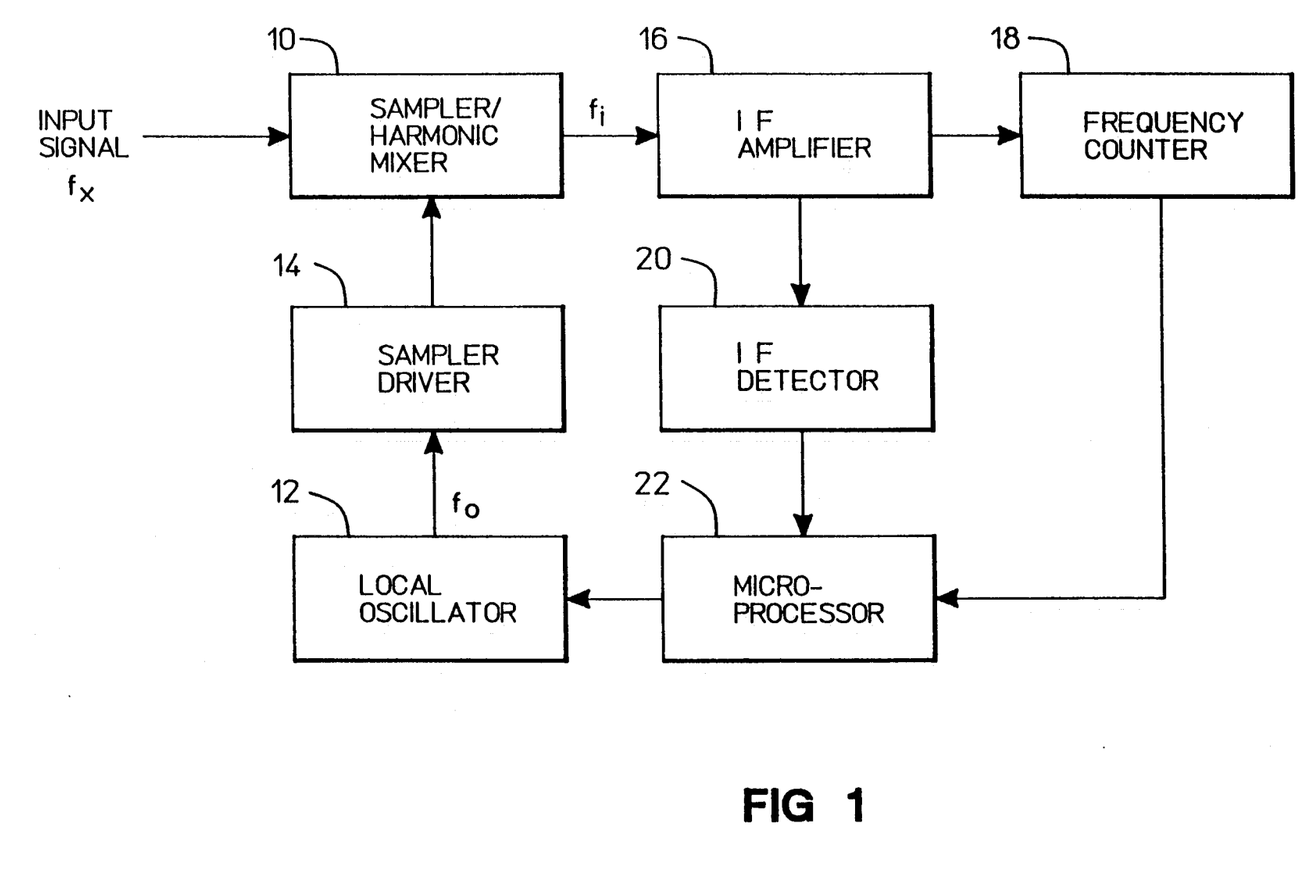
FIG. 1 is a block diagram of a harmonic heterodyne converter.

A block diagram of a harmonic heterodyne converter is shown in FIG. 1. An input signal of unknown frequency is supplied to one input of a sampler/harmonic mixer 10. The output of a local oscillator 12 is coupled through a sampler driver 14 to a second input of sampler 10. The local oscillator 12, which is a programmable frequency synthesizer, supplies a waveform to sampler 10. Sampler 10 functions as a harmonic mixer and produces at its output intermediate frequencies (IF) related to the input signal frequency and to the local oscillator frequency and its harmonics. One output of sampler 10 is coupled through an IF amplifier 16 to a frequency counter 18. Another output of IF amplifier 16 is coupled through an IF detector 20 to a microprocessor 22. The microprocessor 22 controls operation of the local oscillator 12 in response to the output of IF detector 20. The computations described hereafter are programmed into the microprocessor 22, so that the harmonic number is determined automatically when a microwave input signal is applied to the sampler 10. An example of a harmonic heterodyne converter is included in the Model 5350 manufactured and sold by Hewlett-Packard Company.

In operation, an input signal of unknown frequency in the microwave frequency range is coupled to sampler 10. The input signal can be continuous wave or pulsed. The microprocessor 22 steps the local oscillator 12 through its range until the sampler 10 provides an intermediate frequency output within an allowed IF band. The intermediate frequency is detected by detector 20 and causes microprocessor 22 to stop shifting the frequency of local oscillator 12. The intermediate frequency is then measured by counter 18.

The frequency $f_x$ of the input signal is given by $$f_x = N f_o \pm f_i \qquad (1)$$

where $f_o$ = local oscillator frequency,
$f_i$ = intermediate frequency, and
N = harmonic number The local oscillator frequency $f_0$ is known. The intermediate frequency $f_i$ is measured by the counter 18. The unknown quantities are the harmonic number N and the sideband (upper and lower). To determine harmonic number and the sign of the intermediate frequency, an additional measurement is taken with the local oscillator frequency offset from its previous value by a small amount at second local oscillator frequency $f_{02}$. The second local oscillator frequency $f_{02}$ produces a second intermediate frequency $f_{i2}$ which is measured by the frequency counter 18. Then the harmonic number N is given by $$N = \text{round} |(f_{i1} - f_{i2})/(f_{01} - f_{02})| \qquad (2)$$

where $f_{i1}$ = first intermediate frequency,
$f_{i2}$ = second intermediate frequency,
$f_{01}$ = first local oscillator frequency, and
$f_{02}$ = second local oscillator frequency.

The first local oscillator frequency $f_{01}$ and the second local oscillator frequency are closely-spaced to insure that both intermediate frequencies fall within the intermediate frequency band of the harmonic heterodyne converter and relate to the same harmonic number. The local oscillator frequency is typically offset by 0.5 MHz. The sideband is determined by the direction of the change in the intermediate frequency between the first and second measurements. When the intermediate frequency increases, the correct sideband is the lower sideband, and when the intermediate frequency decreases, the correct sideband is the upper sideband.

In an example of a microwave frequency counter, utilizing a harmonic heterodyne converter as shown in FIG. 1, the input signal can be in a range from 500 MHz to 20 gigahertz, the intermediate frequency range is 45 MHz to 95 MHz, and the local oscillator frequency range is 295 MHz to 350 MHz. This produces harmonic numbers in the range of about 1–70.

The determination of harmonic number N is subject to various errors. The expression for N including errors is given by $$N + \Delta N = |f_{i1} - f_{i2} + e)/(f_{01} - f_{02})| \qquad (3)$$

where $\Delta N$ = error in harmonic number, and
e = error in measuring intermediate frequency.

From equations (2) and (3), it can be seen that the error in harmonic number $\Delta N$ is given by $$|\Delta N| = |e/(f_{01} - f_{02})| \qquad (4)$$

It is clear from equation (4) that the harmonic number error $\Delta N$ can be minimized by maximizing $f_{01} - f_{02}$, the difference between the local oscillator frequencies used for the two measurements. However, this requirement conflicts with the requirement that the two local oscillator frequencies be closely-spaced in order to insure that both intermediate frequencies fall within the allowed intermediate frequency band. The requirement for closely spaced local oscillator frequencies is particularly important for input signals at the upper end of the frequency range. For example, a 0.5 MHz local oscillator frequency change translates to a 25 MHz change where the harmonic number is 50.

In accordance with the present invention, there is provided a method for determining harmonic number which reduces the harmonic number error while avoiding the conflicting requirements relating to the magnitude of the change in local oscillator frequencies described above. The invention involves the basic steps of determining an estimated harmonic number from a first set of measurements using closely-spaced first and second local oscillator frequencies. This step corresponds to the procedure described above for determining N. The estimated harmonic number may include errors. Next, the estimated harmonic number is used to compute widely-spaced local oscillator frequencies which are used to make a second set of measurements. The use of the estimated harmonic number in computing widely-spaced local oscillator frequencies insures that the widely-spaced local oscillator frequencies produce intermediate frequencies in the required intermediate frequency band using a known harmonic number. In one embodiment of the invention, the frequencies of the second set of measurements are at different harmonic numbers. In another embodiment of the invention, the first and second sets of measurements are made at the same harmonic number.

In connection with the present invention, a generalized harmonic number H is defined as follows $$H = \text{round}\,[\Delta f_i / \Delta f_o] = \pm N \tag{5}$$

It can be seen from equation (5) that the generalized harmonic number H includes sideband information. In addition, a variable k is defined as follows $$k = |H3| - |H1| = N3 - N1 \tag{6}$$

where $N = |H|$, H3 is the generalized harmonic number corresponding to a local oscillator frequency $f_{03}$, and H1 is the generalized harmonic number corresponding to a local oscillator frequency $f_{01}$. The variable k is an integer and represents the difference between the harmonic number and the harmonic number corresponding to the second set of measurements. If $k=0$, the harmonic number is the same for both sets of measurements. According to the invention, local oscillator frequency $f_{03}$ that is used for the second set of measurements is computed as follows $$f_{03} = f_{01} + [s_3.f_{i3} - s_1.f_{i1} - k.f_{01}]/[N1 + k] \tag{7}$$

where $s = 1$ for H positive, $-1$ for H negative, and $f_{i3}$ = third intermediate frequency. Equation (7) is used to determine the third local oscillator frequency $f_{03}$ required to center the corresponding intermediate frequency. This is done by setting $f_{i3} = f_c$, where $f_c$ represents the center frequency of the intermediate frequency band, and using the estimated harmonic number determined in the first step of the process in place of the actual harmonic number. Equation (7) then becomes $$f_{03} = f_{01} + [s_3.f_c - s_1.f_{i1} - k.f_{01}]/[N1_{est} + k] \tag{8}$$

where $N1_{est}$ = estimated harmonic number. When the estimated harmonic number $N1_{est}$ is in error, the third local oscillator frequency $f_{03}$ determined by equation (8) will not center the intermediate frequency, and the third intermediate frequency $f_{i3}$ measured after setting the local oscillator frequency $f_{03}$ will deviate from the center frequency $f_c$. Defining the error in harmonic number N1 as $N1_{err}$ ($N1_{err}$ is the difference between $N1_{est}$ and $N_1$), the resulting error in $f_{i3}$ is given by $$f_{i3} - f_c = -s_3(f_{03} - f_{01})(N1_{err}) \tag{9}$$

Equation (9) determines how far the intermediate frequency $f_{i3}$ is from the desired center frequency $f_c$. Equation (9) and the maximum allowable error in $f_{i3}$ can be utilized to determine the maximum allowable difference between local oscillator frequencies ($f_{03} - f_{01}$). The objective is to choose k and $s_3$ in such a way to maximize $|f_{03} - f_{01}|$. The corrected harmonic number $H1_{crc}$ is given by $$H1_{crc} = \text{round}\,\{s_1.k.f_{03}/(f_{01} - f_{03}) + [f_{i1} - s_1.s_3.f_{i3}]/(f_{01} - f_{03})\} \tag{10}$$

Figure 2:
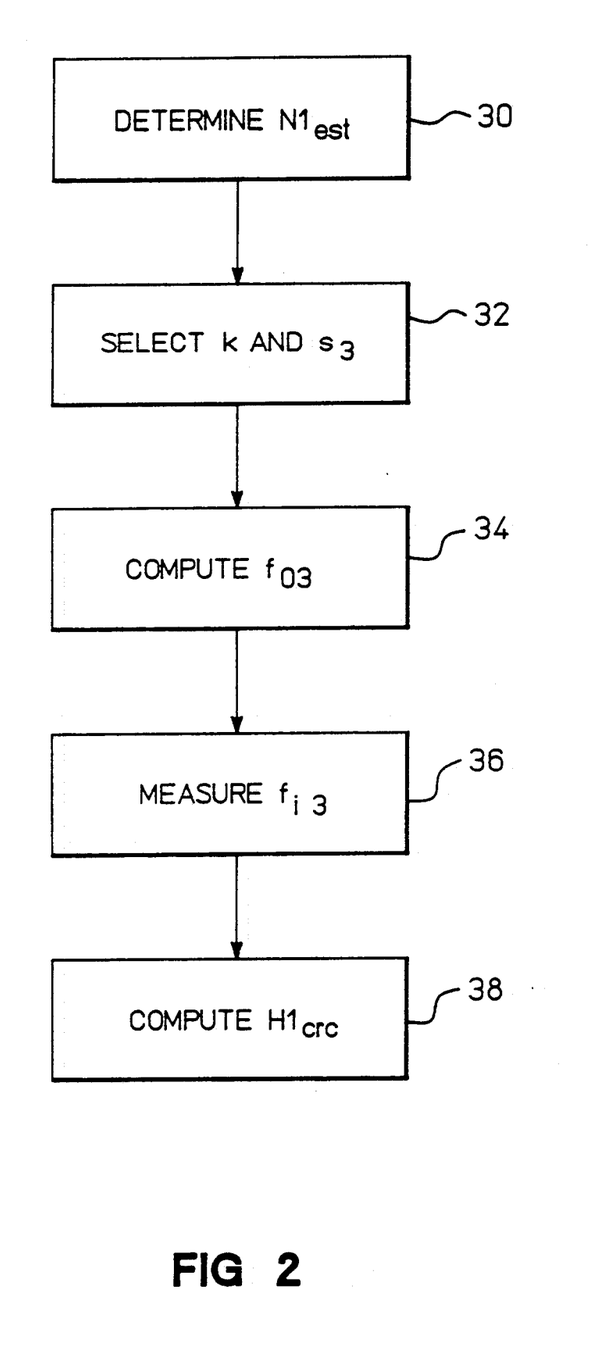
FIG. 2 is a flow diagram illustrating harmonic number determination in accordance with a preferred embodiment of the present invention.

The procedure for determining harmonic number is now summarized with reference to FIG. 2. Initially, an estimated harmonic number $H1_{est}$ is determined in step 30 utilizing the procedure described above. That is, the local oscillator 12 is stepped through its range until the sampler 10 provides an output within the intermediate frequency band. The first intermediate frequency is measured. Then, the local oscillator 12 is offset, typically by 0.5 MHz, and a second intermediate frequency is measured. The estimated harmonic number $H1_{est}$ is determined in accordance with equation (5).

Next, values of k and $s_3$ are selected in step 32. This corresponds to selecting a different harmonic number from the estimated harmonic number and selecting an upper or lower sideband for a second set of measurements. Typically, the variable k is selected as plus or minus one, corresponding to the adjacent harmonic number, and $s_3$ is set equal to $s_1$. Selecting $k=0$ is a special case discussed below as an alternate procedure for small harmonic numbers, with reference to FIG. 3.

Next, the third local oscillator frequency $f_{o3}$ is computed in step 34 using equation 8, the estimated harmonic number, the selected values of k and $s_3$ and the center frequency $f_c$ of the intermediate frequency band. The computed value of the third local oscillator frequency $f_{o3}$ insures that the third intermediate frequency $f_{i3}$ is at the center of the intermediate frequency band in the case where the estimated harmonic number is correct.

In computing the third local oscillator frequency $f_{o3}$, it is possible that the computed frequency falls outside the range of the local oscillator. To avoid this condition, the computed third local oscillator frequency $f_{o3}$ is compared with the frequency range of the local oscillator. If $f_{o3}$ is outside the local oscillator frequency range, the third local oscillator frequency is set using equation (8) and selecting different values for k and/or $s_3$.

The third intermediate frequency $f_{i3}$ is measured in step 36 using the third local oscillator frequency $f_{o3}$. All of the values required for equation (10) are now known. The corrected harmonic number $H1_{crc}$ is computed in step 38 using equation (10). Alternatively, the second local oscillator frequency $f_{o2}$ and the second intermediate frequency $f_{i2}$ can be used to compute the third local oscillator frequency $f_{o3}$ and to compute the corrected harmonic number.

Figure 4A:
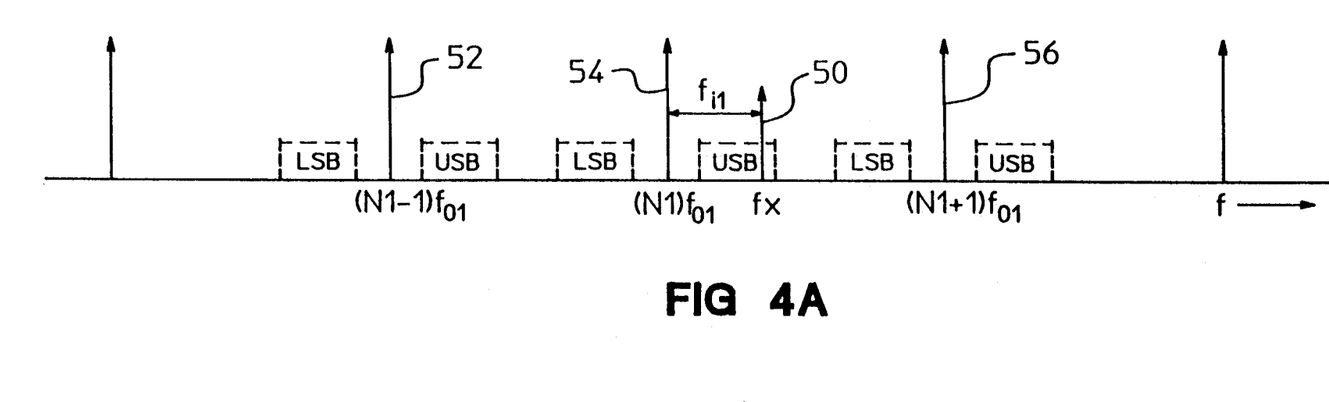
FIGS. 4A and 4B are graphic representations of a segment of a frequency spectrum showing the frequencies associated with the present invention.
Figure 4B:
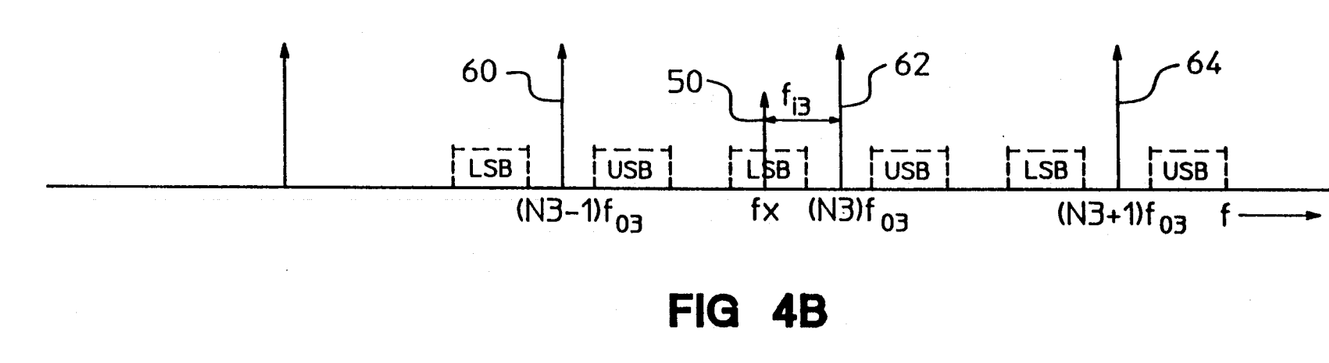

The relationship between the various frequencies involved in the method of the present invention are illustrated in FIGS. 4A and 4B, each of which represents a segment of the frequency spectrum. The horizontal axis represents frequency, and vertical arrows represent signals. In FIGS. 4A and 4B, the input signal frequency $f_x$ is represented by arrow 50. The harmonics of a first local oscillator frequency $f_{o1}$ are represented by arrows 52, 54, 56, etc. Each harmonic is shown as having an upper sideband (USB) and a lower sideband (LSB). The harmonic 54, having a harmonic number N1, when mixed with the input signal at frequency $f_x$, produces an intermediate frequency $f_{i1}$ within the intermediate frequency band. Intermediate frequency $f_{i1}$ is the difference in frequency between harmonic 54 and input signal 50. The local oscillator frequency $f_{o1}$ and a second local oscillator frequency $f_{o2}$ (not shown), which is slightly offset from frequency from $f_{o1}$, are used to obtain an estimate of N1 as described above.

Referring now to FIG. 4B, a third local oscillator frequency $f_{o3}$ is selected as described above. The third local oscillator frequency $f_{o3}$ produces harmonics 60, 62, 64, etc. The harmonic 62 having a harmonic number N3 (which differs from N1 by k), when mixed with the input signal 50 at frequency $f_x$ produces an intermediate frequency $f_{i3}$ within the intermediate frequency band of the detector. The values associated with the two sets of conditions shown in FIGS. 4A and 4B are used to calculate a corrected harmonic number as described above.

The above described method for determining harmonic number will now be illustrated by way of example. In a first example, assume the following conditions
$f_x = 10$ gigahertz
$f_{o1} = 330.5$ MHz
$f_{i1} = 85$ MHz
$H1 = -30$
$H1_{est} = -30$
Desired $f_{i3} = f_c = 70$ MHz
$k = +1$ $s_3 = -1$ The estimated harmonic number is determined as described above. The above values are substituted into in equation (8) to compute a third local oscillator frequency $f_{o3}$ of 320.32 MHz. The third intermediate frequency $f_{i3}$ is measured at 70 MHz, since the estimated harmonic number H1 was correct. Then, the corrected harmonic number $H1_{crc}$ is computed in accordance with equation (10) and is determined to be $-30$.

In a second example, assume the same parameters as in the first example with the exception that the estimated harmonic number $H1_{est}$ is $-29$ (since an error occurred in estimating H1). Based on the estimated harmonic number $H1_{est}$ and the other parameters, the third intermediate frequency $f_{o3}$ is computed in accordance with equation (8) to be 319.98 MHz. In this case, the third intermediate frequency $f_{i3}$ is measured at 80.52 MHz. The measured value of the third intermediate frequency $f_{i3}$ differs from the desired value of 70 MHz because the estimated harmonic number H1 was in error. However, the measurement was taken in the upper sideband of harmonic number 31 as a result of selecting $k = +1$ and $s_3 = -1$, coupled with the fact that the true value of H1 is $-30$. Substitution of the required values into equation (10) yields a corrected harmonic number $H1_{crc}$ of $-30$. Thus, the error that occurred in the estimated harmonic number has been corrected by the procedure of the present invention.

Figure 3:
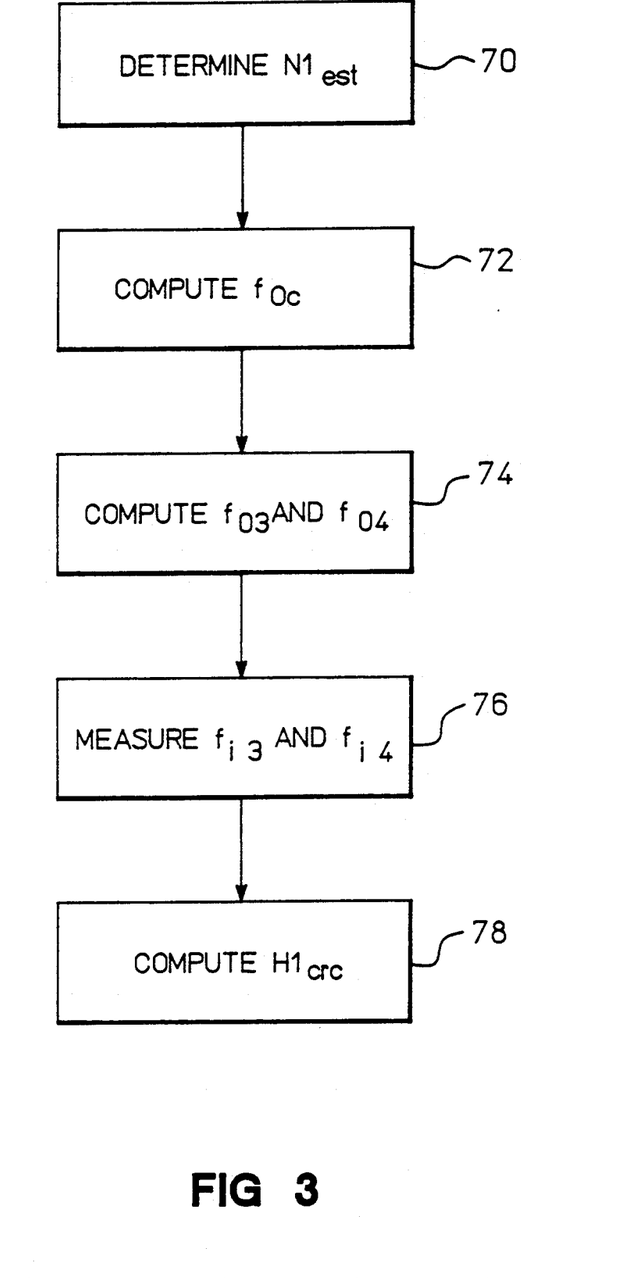
FIG. 3 is a flow diagram illustrating harmonic number determination in accordance with an alternate embodiment of the invention.

The above-described procedure for determining harmonic number sometimes produces results outside the band of the local oscillator range or the intermediate frequency band in cases of low harmonic numbers. In this situation, an alternate procedure is utilized. In the above-described example where the local oscillator has a range of 295-350 MHz and the intermediate frequency has a range of 45-95 MHz, the above procedure works well for harmonic numbers greater than 18. The following procedure is utilized for harmonic numbers less than 18. The alternate procedure is described with reference to FIG. 3. Initially, an estimated harmonic number $H1_{est}$ is determined in step 70 in the manner described above. The alternate procedure differs from the previously-described procedure in that the variable $k=0$; that is, the second set of measurements is made with the same harmonic number as was utilized in determining the estimated harmonic number. Next, a local oscillator frequency $f_{0c}$ is computed in step 72. The frequency $f_{i1}$ was measured in determining the estimated harmonic number. The local oscillator center frequency $f_{0c}$ is determined in accordance with the following relationships $$f_{oL} = f_{o1} - (f_{i1} - f_{i\ min})/H1_{est} \qquad (11)$$

$$f_{oU} = f_{o1} - (f_{i\ max} - f_{i1})/H1_{est} \qquad (12)$$

$$f_{oc} = (f_{oL} + f_{oU})/2 \qquad (13)$$

where $f_{oL}$ = local oscillator frequency producing the lower intermediate frequency
$f_{oU}$ = local oscillator frequency producing the upper intermediate frequency
$f_{i\ min}$ = minimum intermediate frequency
$f_{i\ max}$ = maximum intermediate frequency If either oscillator frequency $f_{oL}$ or $f_{oU}$ is greater than the maximum frequency of the local oscillator, that frequency is reduced to the maximum local oscillator frequency. If either frequency $f_{oL}$ or $f_{oO}$ is less than the minimum frequency of the local oscillator, that frequency is increased to the minimum local oscillator frequency.

Next, a third local oscillator frequency $f_{03}$ and a fourth local oscillator frequency $f_{04}$ are computed in step 74. These values are computed as prescribed frequency offsets above and below the local oscillator center frequency $f_{0c}$. The maximum offset consistent with the harmonic number and intermediate frequency bandwidth is selected. Defining a predetermined frequency difference D, the third and fourth local oscillator frequencies $f_{03}$ and $f_{04}$ are computed as $f_{03} = f_{0c} - (D/2)$ and $f_{04} = f_{0c} + (D/2)$. Typically, the offset is 1 MHz. Thus, the third local oscillator frequency $f_{03}$ is 1 MHz less than $f_{0c}$, and the fourth local oscillator frequency $f_{04}$ is 1 MHz greater than $f_{0c}$ so that the third and fourth local oscillator frequencies are separated by 2 MHz. The third and fourth intermediate frequencies $f_{i3}$ and $f_{i4}$ are measured in step 76, and the corrected harmonic number $H1_{crc}$ is computed in step 78 utilizing equation (5) (since the frequencies in the second set of measurements are in the same sideband of the same harmonic number).

While there have been shown and described what are at present considered the preferred embodiments of the present invention, it will be obvious to those skilled in the art that various changes and modifications may be made therein without departing from the scope of the invention as defined by the appended claims.

What is claimed is:

1. In a harmonic heterodyne converter wherein the frequency of an input signal is determined from a local oscillator frequency, an intermediate frequency obtained by mixing the local oscillator frequency with the input signal, and a harmonic number, a method for determining a generalized harmonic number H, comprising the steps of:

computing an estimated generalized harmonic number $H1_{est}$ from closely-spaced first and second local oscillator frequencies $f_{01}$ and $f_{02}$ and first and second intermediate frequencies $f_{i1}$ and $f_{i2}$ obtained by successively mixing said first and second local oscillator frequencies with the input signal;

selecting a third local oscillator frequency $f_{03}$ such that the corresponding generalized harmonic number H3 differs from the estimated harmonic number by a predetermined integer, k;

measuring a third intermediate frequency $f_{i3}$ obtained by mixing the third local oscillator frequency with the input signal; and computing a corrected generalized harmonic number $H1_{crc}$ from the first and third local oscillator frequencies and the first and third intermediate frequencies.

2. A method as defined in claim 1 wherein the step of selecting a third local oscillator frequency includes the steps of selecting a value of k and selecting a value of $s_3$ where $s_3$ represents the sign of H3.

3. A method as defined in claim 2 wherein the step of selecting a third local oscillator frequency includes the step of computing the third oscillator frequency $f_{03}$ in accordance with the equation $$f_{03} = f_{01} + [s_3 \cdot f_c - s_1 \cdot f_{i1} - k \cdot f_{01}]/[N1_{est} + k],$$

where $f_c$ = center frequency of the intermediate frequency band of said harmonic heterodyne converter, $N1_{est}$, $|H1_{est}|$, $s_1$ = sing of $H1_{est}$.

4. A method as defined claim 3 wherein the third local oscillator frequency is selected such that $k = \pm 1$ and $s_1 = s_3$.

5. A method as defined in claim 3 wherein the step of computing a corrected generalized harmonic number includes the step of computing a corrected generalized harmonic number $H1_{crc}$ in accordance with the equation $$H1_{crc} = \text{round}\{s_1 \cdot k \cdot f_{03}/(f_{01} - f_{03}) + [f_{i1} - s_1 \cdot s_3 \cdot f_{i3}]/(f_{01} - f_{03})\}$$

where round represents rounding of the value contained in brackets to the nearest integer.

6. In a harmonic heterodyne converter wherein the frequency of an input signal is determined from a local oscillator frequency, an intermediate frequency obtained by mixing the local oscillator frequency with the input signal, and a harmonic number, a method for determining a generalized harmonic number, comprising the steps of:

computing an estimated harmonic number from closely-spaced first and second local oscillator frequencies and first and second intermediate frequencies obtained by successively mixing said first and second local oscillator frequencies with the input signal;

selecting third and fourth local oscillator frequencies that produce intermediate frequencies within an allowable range at the same harmonic number as the estimated harmonic number and that are widely spaced;

measuring third and fourth intermediate frequencies obtained by successively mixing the third and fourth local oscillator frequencies with the input signal; and computing a corrected generalized harmonic number from the third and fourth local oscillator frequencies and the third and fourth intermediate frequencies.

7. A method as defined in claim 6 wherein the step of selecting third and fourth local oscillator frequencies includes the steps of computing a local oscillator center frequency consistent with the estimated harmonic number and the intermediate frequency range, and selecting the third and fourth local oscillator frequencies above and below the local oscillator center frequency by a predetermined frequency difference.

8. A method as defined in claim 7 wherein the step of computing a local oscillator center frequency includes the steps of computing two local oscillator frequencies, $f_{oU}$ and $f_{oL}$, in accordance with the equations $$f_{oU} = f_{01} - (f_{i1} - f_{i\,min})/H1_{est}$$

$$f_{oL} = f_{01} - (f_{i\,max} - f_{i1})/H1_{est}$$

where $f_{01}$ = first local oscillator frequency, $f_{i1}$ = first intermediate frequency, $f_{i\,min}$ = minimum intermediate frequency, $f_{i\,max}$ = maximum intermediate frequency, and $H1_{est}$ = estimated generalized harmonic number, and computing the local oscillator center frequency as the average of frequencies $f_{oU}$ and $f_{oL}$ in accordance with $f_{oc} = (f_{oU} + f_{oL})/2$.

9. A method as defined in claim 8 wherein the step of selecting the third and fourth local oscillator frequencies includes the step of calculating a third local oscillator frequency $f_{03}$ and a fourth local oscillator $f_{04}$ in accordance with $$f_{03} = f_{oc} - (D/2)$$

$$f_{04} = f_{oc} + (D/2)$$

where D = the predetermined frequency difference.

10. A method as defined in claim 8 further including the step of reducing the local oscillator frequencies $f_{oU}$ or $f_{oL}$ to a maximum local oscillator frequency if either local oscillator frequency $f_{oU}$ or $f_{oL}$ is greater than the maximum local oscillator frequency.

11. A method as defined in claim 8 further including the step of increasing the local oscillator frequencies $f_{oU}$ or $f_{oL}$ to a minimum local oscillator frequency if either local oscillator frequency $f_{oU}$ or $f_{oL}$ less than the minimum local oscillator frequency.

12. In a harmonic heterodyne converter wherein the frequency of an input signal is determined from a local oscillator frequency, an intermediate frequency obtained by successively mixing the local oscillator frequency with the input signal, and a harmonic number, a method for determining a generalized harmonic number, comprising the steps of:

computing an estimated harmonic number from closely-spaced first and second local oscillator frequencies and first and second intermediate frequencies obtained by successively mixing said first and second local oscillator frequencies with the input signal;

when the estimated harmonic number is equal to or greater than a predetermined value, selecting a third local oscillator frequency $f_{03}$ such that the corresponding harmonic number N3 differs from the estimated harmonic number by a predetermined integer, k;

measuring a third intermediate frequency $f_{i3}$ obtained by mixing the third local oscillator frequency with the input signal; and computing a corrected generalized harmonic number from the first and third local oscillator frequencies and the first and third intermediate frequencies; and when the estimated harmonic number is less than said predetermined value, selecting fourth and fifth local oscillator frequencies that produce intermediate frequencies within an allowable range at the same harmonic number as the estimated harmonic number and that are widely spaced;

measuring fourth and fifth intermediate frequencies obtained by successively mixing the fourth and fifth local oscillator frequencies with the input signal; and computing a corrected generalized harmonic number from the fourth and fifth local oscillator frequencies and the fourth and fifth intermediate frequencies.

13. Apparatus for determining harmonic number in a harmonic heterodyne converter wherein the frequency of an input signal is determined from a local oscillator frequency, an intermediate frequency obtained by mixing the local oscillator frequency with the input signal and a generalized harmonic number, said apparatus comprising:

means for computing an estimated generalized harmonic number $H1_{est}$ from closely-spaced first and second local oscillator frequencies $f_{01}$ and $f_{02}$ and first and second intermediate frequencies $f_{i1}$ and $f_{i2}$ obtained by successively mixing said first and second local oscillator frequencies with the input signal;

means for selecting a third local oscillator frequency $f_{03}$ such that the corresponding harmonic number N3 differs from the estimated harmonic number by a predetermined integer k;

means for measuring a third intermediate frequency $f_{i3}$ obtained by mixing the third local oscillator frequency with the input signal; and means for computing a corrected generalized harmonic number $H1_{crc}$ from the first and third local oscillator frequencies and the first and third intermediate frequencies.

14. Apparatus for determining a harmonic number in a harmonic heterodyne converter wherein the frequency of an input signal is determined from a local oscillator frequency, an intermediate frequency obtained by mixing the local oscillator frequency with the input signal, and a generalized harmonic number, said apparatus comprising;

means for computing an estimated harmonic number from closely-spaced first and second local oscillator frequencies and first and second intermediate frequencies obtained by successively mixing said first and second local oscillator frequencies with the input signal;

means for selecting third and fourth local oscillator frequencies that produce intermediate frequencies within an allowable range at the same harmonic number as the estimated harmonic number and that are widely-spaced;

means for measuring third and fourth intermediate frequencies obtained by mixing the third and fourth local oscillator frequencies with the input signal; and means for computing a corrected generalized harmonic number from the third and fourth local oscillator frequencies and the third and fourth intermediate frequencies.

15. In a harmonic heterodyne converter wherein the frequency of an input signal is determined from a local oscillator frequency, an intermediate frequency obtained by mixing the local oscillator frequency with the input signal, and a harmonic number, a method for determining a generalized harmonic number comprising the steps of:

computing an estimated harmonic number from closely-spaced first and second local oscillator frequencies and first and second intermediate frequencies obtained by successively mixing said first and second local oscillator frequencies with the input signal;

selecting widely-spaced local oscillator frequencies that have a known relationship to the estimated harmonic number and that correspond to intermediate frequencies within the intermediate frequency band of the converter;

measuring intermediate frequencies obtained by mixing the widely-spaced local oscillator frequencies with the input signal; and computing a corrected generalized harmonic number from the widely-spaced local oscillator frequencies and the corresponding intermediate frequencies.

* * * * *